United States Patent [19]

Sezi et al.

[11] Patent Number: 5,703,186

[45] Date of Patent: Dec. 30, 1997

[54] MIXED POLYMERS

[75] Inventors: Recai Sezi, Roettenbach; Horst Borndoerfer, Erlangen; Hellmut Ahne, Roettenbach; Siegfried Birkle, Hoechstadt A/Aisch; Eberhard Kuehn, Hemhofen; Rainer Leuschner, Erlangen; Eva Rissel, Forchheim; Michael Sebald, Hessdorf-Hannberg, all of Germany

[73] Assignee: Siemens Aktiengesellschaft, Munich, Germany

[21] Appl. No.: 717,652

[22] Filed: Sep. 23, 1996

Related U.S. Application Data

[62] Division of Ser. No. 434,955, May 4, 1995, Pat. No. 5,616,667, which is a continuation of Ser. No. 153,836, Nov. 17, 1993, abandoned, which is a continuation of Ser. No. 811,831, Dec. 20, 1991, abandoned.

[30] Foreign Application Priority Data

Dec. 20, 1990 [DE] Germany ............... 40 41 000.5

[51] Int. Cl.$^6$ ............... C08F 222/04; C08F 222/08; C08F 220/18
[52] U.S. Cl. ............... 526/272; 526/329.2
[58] Field of Search ............... 526/272, 329.2

[56] References Cited

U.S. PATENT DOCUMENTS

| 3,184,440 | 5/1965 | Chadha et al. . |
| 3,677,991 | 7/1972 | Moore . |
| 4,491,628 | 1/1985 | Ito et al. . |
| 4,868,259 | 9/1989 | Burroway et al. . |
| 5,221,787 | 6/1993 | Robison et al. ............ 526/272 |

FOREIGN PATENT DOCUMENTS

| 0 102 450 | 5/1983 | European Pat. Off. . |
| 0 388 484 | 3/1989 | European Pat. Off. . |
| 0 394 740 | 4/1990 | European Pat. Off. . |
| 0 394 741 | 4/1990 | European Pat. Off. . |
| 0 395 917 | 4/1990 | European Pat. Off. . |

OTHER PUBLICATIONS

Macromolecules, vol. 21 (1988) pp. 1475–1482.

Primary Examiner—Joseph L. Schofer
Assistant Examiner—Wu C. Cheng
Attorney, Agent, or Firm—Kenyon & Kenyon

[57] ABSTRACT

Premixed polymers which can serve as base polymers for high-resolution resists are structured from 40 to 99 mole % of a tert. butyl ester of an unsaturated carboxylic acid and 1 to 60 mole % of an anhydride of an unsaturated carboxylic acid.

9 Claims, No Drawings

MIXED POLYMERS

This application is a division of application Ser. No. 08/434,955, filed on May 4, 1995, now U.S. Pat. No. 5,616,667 which is a continuation of Ser. No. 08/153,836 filed Nov. 17, 1993, now abandoned, which is a continuation of Ser. No. 07/811,831 filed Dec. 20, 1991, now abandoned.

BACKGROUND OF THE INVENTION

1. Field of the Invention

The invention relates to new mixed polymers which can serve as base polymers for high-resolution resists.

2. Description of Related Art

Highly sensitive resist systems contain homopolymers of acrylic acid, methacrylic acid or vinyl benzoic acid tert. butyl esters, for example (see in this regard U.S. Pat. No. 4,491,628). The use of polymers containing anhydride groups in resists is also known (see EP-OS 0 388 484, 0 394 740, 0 394 741 and 0 395 917).

SUMMARY OF THE INVENTION

It is the object of the invention to provide new defined mixed polymers.

This is accomplished, according to the invention, with mixed polymers which are structured from 40 to 99 mole % of a tert. butyl ester of an unsaturated carboxylic acid (component A) and 1 to 60 mole % of an anhydride of an unsaturated carboxylic acid (Component B). The components A and B total 100% in each case.

DETAILED DESCRIPTION OF THE INVENTION

The invention provides defined mixed polymers (based on carboxylic acid tert. butyl esters and carboxylic acid anhydrides), i.e. polymers in which the type and proportion of the basic components are determined by the monomer mixture; such polymers have not been known until now. Until now, only undefined terpolymers of tert. butyl methacrylate, methacrylic acid and methacrylic acid anhydride, which occur when tert. butyl methacrylate homopolymers are heated after UV exposure, in the presence of a sulfonium salt, were known (see in this regard: "Macromolecules," Vol. 21 (1988), pages 1475 to 1482).

In the mixed polymers according to the invention, Component A is preferably acrylic acid tert. butyl ester, methacrylic acid tert. butyl ester, or vinyl benzoic acid tert. butyl ester In addition, the tert. butyl esters of maleic acid, fumaric acid and cinnamic acid are possible polymerizable monomers, for example. Component B is preferably maleic acid anhydride. Another polymerizable monomer is itaconic acid anhydride, for example.

The mixed polymers according to the invention can be structured not only as bipolymers (of the type stated above), but also as terpolymers. In such polymers, an unsaturated aromatic compound (Component C) is also built in, i.e. an aromatic compound with an olefinically unsaturated substituent. Styrene, α-methyl styrene or vinyl naphthalene preferably serve as Component C. In general, polymerizable aromatic compounds, even those with a polycyclic or heterocyclic structure, especially substituted styrenes and vinyl naphthalenes, are possibilities for Component C. By building in a third monomer component, certain properties of the polymers, for example plasma etch resistance can be improved.

The mixed polymers according to the invention are produced in such a manner that a tert. butyl ester of an unsaturated carboxylic acid, together with a radical initiator and, if applicable, an unsaturated aromatic compound of the type stated, is slowly added to a solution of an anhydride of an unsaturated carboxylic acid in an organic solvent, which is at a raised temperature. It is advantageous if the polymerizable tert. butyl ester is dripped into a boiling anhydride solution together with the initiator, which is preferably azoisobutyric acid nitrile; toluene or ethyl acetate serves as the solvent, for example. In this manner, a high proportion of the anhydride is built into the mixed polymer.

The mixed polymers according to the invention can advantageously be used as base polymers for high-resolution resists which function in positive or negative manner; see in this regard the cofiled U.S. patent application Ser. No. 08/811,824—"Photoresist." Such resists demonstrate high sensitivity especially in the DUV range (Deep UV). The anhydride functions present in the mixed polymers lead to a clear increase in the etch resistance, after exposure or exposure and development by reaction with suitable substances. In comparison with the resist systems according to U.S. Pat. No. 4,491,622, which contain homopolymers of tert. butyl esters, resists with polymers according to the invention offer the advantage that they demonstrate anhydride functions, which are stable in solution when stored, and which allow an in situ modification for the purpose of increasing the etch resistance.

Even if the mixed polymers according to the invention demonstrate a high proportion of anhydride, and correspondingly a lower proportion of ester, the sensitivity of the resists obtained from these polymers does not suffer. In addition, clearly higher etch resistance against oxygen plasmas is achieved with such resists after an in situ reaction with a silylation reagent, especially an aminoalkyl siloxane, in comparison with other systems. For this reason, these resists can be used for dry development resist techniques where very strict development conditions are applied. This is particularly true for two-stage etching processes, in which etching takes place with a plasma containing halogen in the first stage, and with pure oxygen plasma in the second stage, in order to completely remove the bottom resist. Furthermore, the polymers according to the invention surprisingly demonstrate clearly greater etch and dose tolerances than comparable systems (see EP-OS 0 395 917 in this regard, for example). The mixed polymers according to the invention are therefore used in the production of structures in the submicron range; see in this regard the German patent application number P 40 41 002.1—"Production of Photolithographic Structures."

The invention will be explained in greater detail in the following illustrative examples.

EXAMPLE 1

12.75 g maleic acid anhydride (0.13 mole) are dissolved in 77 ml boiling toluene. 14.22 g freshly distilled methacrylic acid tert. butyl ester (0.1 mole) in which 0.188 g azoisobutyric acid nitrile (0.00115 mole) have been dissolved are slowly dripped into this solution; the toluene solution continues boiling at all times. After the addition is complete (approximately 15 min), the solution is boiled for another 60 min under reflux, then allowed to cool to room temperature. The fine-flake product obtained by precipitation with approximately 1.5 l isopropanol is filtered off, washed three times with isopropanol and dried to weight constancy in the vacuum cabinet; 18 g white powder are obtained. The infrared spectrum clearly shows the existence of the expected copolymer of methacrylic acid tert. butyl ester and maleic acid anhydride; thermal cracking (TGA, peak maximum): 163° C.; anhydride proportion (TGA): 50 mole %.

EXAMPLE 2

12.75 g maleic acid anhydride (0.13 mole) are dissolved in 50 ml boiling ethyl acetate. A mixture of 14.22 g freshly distilled methacrylic acid tert. butyl ester (0.1 mole) and 27 ml ethyl acetate, in which 0.188 g azoisobutyric acid nitrile (0.00115 mole) have been dissolved, are slowly dripped into this solution; the ethyl acetate solution continues boiling at all times. After the addition is complete (approximately 15 min), the solution is boiled for another 60 min under reflux, then allowed to cool to room temperature. The coarse-flake product obtained by precipitation with approximately 1.5 l isopropanol is filtered off, washed three times with isopropanol and dried to weight constancy in the vacuum cabinet; 18.4 g slightly yellowish powder are obtained. By dissolving this product in 2-butanone and reprecipitation in isopropanol, a white powder is obtained. The infrared spectrum clearly shows the existence of the expected copolymer of methacrylic acid tert. butyl ester and maleic acid anhydride; thermal cracking (TGA, peak maximum): 169° C.; anhydride proportion (TGA): 50 mole %.

EXAMPLE 3

32.36 g maleic acid anhydride (0.33 mole) are dissolved in 210 ml boiling toluene. 38.45 g freshly distilled acrylic acid tert. butyl ester (0.3 mole) in which 0.517 g azoisobutyric acid nitrile (0.00315 mole) have been dissolved are slowly dripped into this solution; the toluene solution continues boiling at all times. After the addition is complete (approximately 15 min), the solution is boiled for another 60 min under reflux, then allowed to cool to room temperature. The fine-flake product obtained by precipitation with approximately 1.5 l isopropanol is filtered off, washed three times with isopropanol and dried to weight constancy in the vacuum cabinet; 44.4 g white powder are obtained. The infrared spectrum clearly shows the existence of the expected copolymer of acrylic acid tert. butyl ester and maleic acid anhydride; thermal cracking (TGA, peak maximum): 152° C.; anhydride proportion (TGA): 50 mole %.

EXAMPLE 4

A resist, consisting of 23.75 parts by mass of a methacrylic acid tert. butyl ester/maleic acid anhydride copolymer produced according to Example 1, 1.25 parts by mass triphenyl sulfonium trifluoromethane sulfonate and 75 parts by mass methoxypropyl acetate is spin-coated onto a silicone wafer (3000 rpm, 20 s), then dried at 90° C. for 60 s; the layer thickness of the resulting film is approximately 1 µm. The film is treated with a solution of 2 parts by mass diaminosiloxane, (Tegomer A-Si 2120; Goldschmidt), 45 parts by mass ethanol and 53 parts by mass isopropanol for 400 s, rinsed with isopropanol for 30 s and then dried; the layer thickness of the film is now 1.4 µm. Subsequently, the wafer is placed in a plasma etching system (Material Research Corporation, Type MIE 720) and dry etched in oxygen plasma for 300 s ($O_2$/RIE: 1.9 mTorr gas pressure, 40V bias voltage, 0.9 kW output, with magnet); after etching, the layer thickness is 1.19 µm. From this, an etch rate of the silylated layer of 0.7 nm/s is calculated.

What is claimed is:

1. A non-grafted terpolymer characterized by 40 to 99 mole % of a tert. butyl ester of an unsaturated carboxylic acid as a first component, 1 to 60 mole % of an anhydride of an unsaturated carboxylic acid as a second component and an unsaturated aromatic compound as a third component.

2. The terpolymer according to claim 1 wherein the first component is one of acrylic acid tert. butyl ester, methacrylic acid tert. butyl ester, and vinyl benzoic acid tert. butyl ester.

3. The terpolymer according to claim 1 wherein the second component is maleic acid anhydride.

4. The terpolymer according to claim 2 wherein the second component is maleic acid anhydride.

5. The terpolymer according to claim 1 wherein the third component is one of styrene, α-methyl styrene and vinyl naphthalene.

6. The terpolymer according to claim 2 wherein the third component is one of styrene, α-methyl styrene and vinyl naphthalene.

7. The terpolymer according to claim 3 wherein the third component is one of styrene, α-methyl styrene and vinyl naphthalene.

8. The terpolymer according to claim 4 wherein the third component is one of styrene, α-methyl styrene and vinyl naphthalene.

9. A non-grafted terpolymer characterized by 40 to 99 mole % of methacrylic acid tert. butyl ester or vinyl benzoic acid tert. butyl ester as a first component, 1 to 60 mole % of an anhydride of an unsaturated carboxylic acid as a second component and an unsaturated aromatic compound as a third component.

* * * * *